(12) United States Patent
Lu et al.

(10) Patent No.: US 6,363,007 B1
(45) Date of Patent: Mar. 26, 2002

(54) MAGNETO-RESISTIVE MEMORY WITH SHARED WORDLINE AND SENSE LINE

(75) Inventors: Yong Lu, Plymouth; Romney R. Katti, Maple Grove, both of MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/638,415

(22) Filed: Aug. 14, 2000

(51) Int. Cl.[7] ............................................. G11C 11/00
(52) U.S. Cl. ........................................ 365/158; 365/171
(58) Field of Search ............................. 365/158, 8, 55, 365/171, 129

(56) References Cited

U.S. PATENT DOCUMENTS

| | | |
|---|---|---|
| 3,573,485 A | 4/1971 | Ballard |
| 4,132,904 A | 1/1979 | Harari |
| 4,553,053 A | 11/1985 | Ong et al. |
| 4,731,757 A | 3/1988 | Daughton et al. |
| 4,751,677 A | 6/1988 | Daughton et al. |
| 4,829,476 A | 5/1989 | Dupuis et al. |
| 4,887,236 A | 12/1989 | Schloemann |
| 5,349,302 A | 9/1994 | Cooper |
| 5,361,226 A | 11/1994 | Taguchi et al. |
| 5,434,826 A | 7/1995 | Ravipati et al. |
| 5,515,314 A | 5/1996 | Kouhei et al. |
| 5,587,943 A | 12/1996 | Torok et al. |
| 5,595,830 A | 1/1997 | Daughton |
| 5,640,343 A | 6/1997 | Gallagher |
| 5,650,887 A | 7/1997 | Dovek et al. |
| 5,650,958 A | 7/1997 | Gallagher et al. |
| 5,654,566 A | 8/1997 | Johnson |
| 5,695,864 A | 12/1997 | Slonczewski |
| 5,701,222 A | 12/1997 | Gill et al. |
| 5,701,223 A | 12/1997 | Fontana, Jr. et al. |
| 5,748,519 A * | 5/1998 | Tehrani et al. ............. 365/98 |
| 5,776,537 A | 7/1998 | Ryan et al. |
| 5,801,529 A | 9/1998 | Umemoto et al. |
| 5,861,328 A | 1/1999 | Tehrani et al. |
| 6,034,887 A * | 3/2000 | Gupta ........................ 365/171 |
| 6,130,835 A * | 10/2000 | Scheuerlein ............... 365/171 |

FOREIGN PATENT DOCUMENTS

| | | |
|---|---|---|
| EP | 0 776 011 A2 | 5/1997 |
| WO | WO 98/20496 | 5/1998 |

OTHER PUBLICATIONS

B Razavi and B.A. Wooley, "Design Techniques for High Speed, High Resolution Comparators," *IEEE Journal of Solid State Circuits*, vol. 27, pp. 1916–1926, Dec. 1992.

\* cited by examiner

*Primary Examiner*—Hoai V. Ho
(74) *Attorney, Agent, or Firm*—Knobbe, Martens, Olson & Bear, LLP (57) ABSTRACT

Methods are disclosed for writing magneto-resistive memory devices. Some of the methods help reduce peak currents during a write, while others increase the speed of the write. To reduce the peak currents, selected control signals such as selected word lines, digital lines and/or sense lines are sequentially activated, rather than activated in parallel. Because the word lines, digital lines and/or sense lines are sequentially activated, the peak currents experienced during a corresponding write may be reduced. To increase the speed of a write, the magnetization vector of the magneto-resistive bits are actively forced to be substantially parallel with the major axis of the magneto-resistive bits, rather than merely drift to that position under the forces inherent in the magneto-resistive bit.

31 Claims, 8 Drawing Sheets

MAGNETO-RESISTIVE MEMORY WITH SHARED WORDLINE AND SENSE LINE

BACKGROUND OF THE INVENTION

This invention relates to the field of magneto-resistive memory devices, and more particularly, to methods and apparatus for writing such magneto-resistive memory devices.

Digital memories of various kinds are used extensively in computer and computer system components, digital processing systems and the like. Such memories can be formed, to considerable advantage, based on the storage of digital bits as alternative states of magnetization of magnetic materials in each memory element, typically thin-film materials. These films may be thin magneto-resistive films having information stored therein based on the direction of the magnetization vector occurring in those films. The information is typically obtained either by inductive sensing to determine the magnetization state, or by magneto-resistive sensing of each state.

Such thin-film magneto-resistive memories may be conveniently provided on the surface of a monolithic integrated circuit to thereby provide easy electrical interconnection between the memory elements and the memory operating circuitry on the monolithic integrated circuit. When so provided, it is desirable to reduce the size and increase the packing density of the thin-film magneto-resistive memory elements to achieve a significant density of stored digital bits.

Many thin-film magneto-resistive memories include a number of parallel word lines intersected by a number of parallel digital lines. A thin magneto-resistive film or magneto-resistive bit is provided at the intersection of each word line and digital line. As such, the thin-film magneto-resistive memory elements are typically configured in an array configuration having a number of rows and a number of columns.

Figure 1:
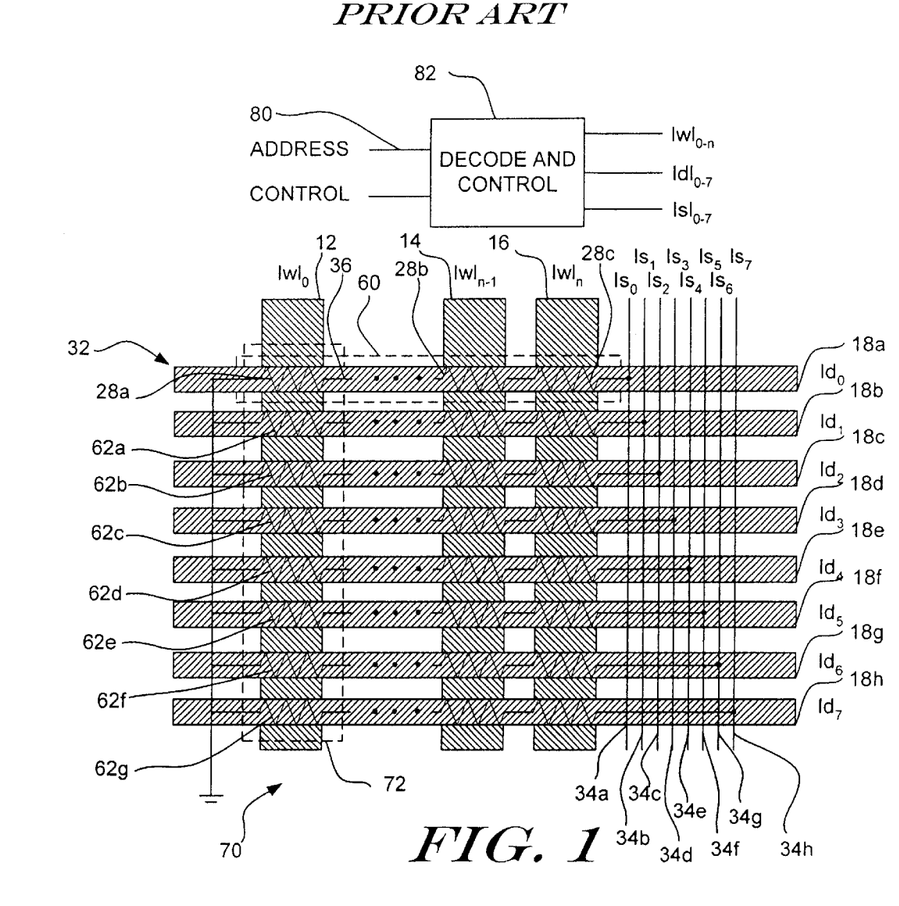
FIG. 1 is a schematic diagram illustrating a typical thin-film Magnetic Random Access Memory (MRAM) architecture.

FIG. 1 is a schematic diagram illustrating a conventional thin-film Magnetic Random Access Memory (MRAM) architecture. Parallel word lines 12, 14, and 16 are provided in a vertical direction and parallel digital lines 18a–18h are provided in a horizontal direction. Only a portion of the MRAM array is shown in FIG. 1. A thin-film magneto-resistive memory element or magneto-resistive bit is provided at the intersection of each word line and digital line. For example, and referring specifically to FIG. 1, thin-film magneto-resistive bits 28a, 28b, and 28c are provided at the intersection of digital line 18a and word lines 12, 14, and 16, respectively.

The thin-film magneto-resistive bits in each row are typically connected in a string configuration to form a corresponding sense line. For example, thin-film magneto-resistive bits 28a, 28b, and 28c, which correspond to row 32, are connected in a string configuration to form sense line 34a. Sense line 34a typically includes a umber of non-magnetic connectors, such as non-magnetic connector 36, to connect each end of the thin-film magneto-resistive bits to the end of the adjacent thin-film magneto-resistive bits. The non-magnetic connectors are typically formed using a conventional metal interconnect layer. The sense lines are used to provide current to a particular row of thin-film magneto-resistive bits, and ultimately, to sense the resistance of a selected one of the bits.

To write a value (i.e., zero or one) to a selected magneto-resistive bit, a word line current is provided to the word line that passes adjacent to selected magneto-resistive bit. Likewise, a digital line current is provided to the digital line that passes adjacent to selected magneto-resistive bit. Depending on the selectivity of the memory, a sense line current may also be provided to the sense line that includes the selected magneto-resistive bit.

Figure 2:
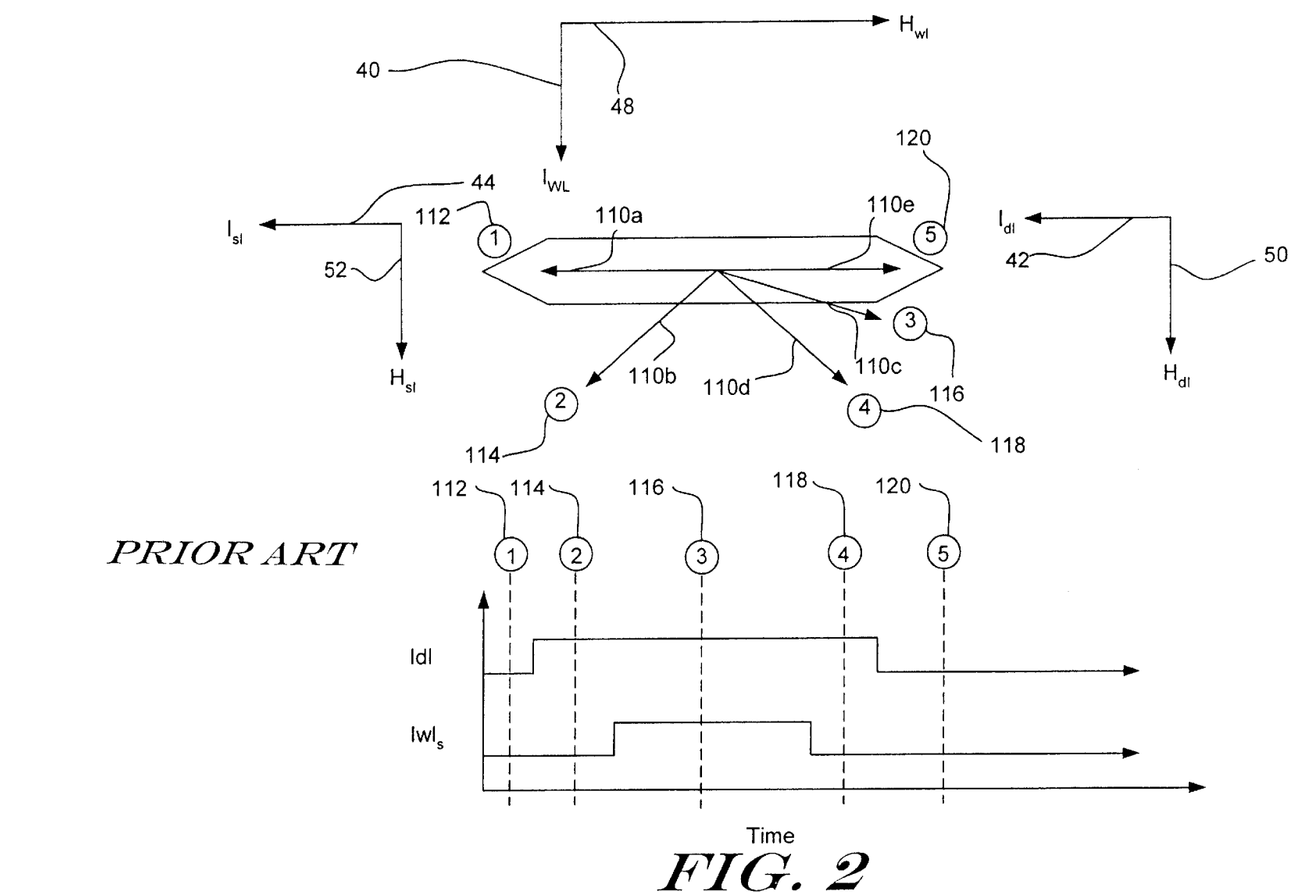
FIG. 2 is a diagram illustrating a conventional method for writing a magneto-resistive bit.

The polarity of the word line current typically determines the value that is written to the selected magneto-resistive bit. To illustrate this further, the magnetic fields produced by a word line current 40, a digital line current 42 and a sense line current 44 at magneto-resistive bit 28a are shown in FIG. 2, assuming digital line 18a and word line 12 extend above magneto-resistive bit 28a. The polarity of the various currents would of course change if the corresponding word line or digital line extend below the magneto-resistive bit 28a.

The magnetic field $H_{wl}$ 48 produced by word line current 40 extends to the right along the major axis of the magneto-resistive bit 28a as shown. The magnetic field Hd 50 produced by digital line current 18a extends downward along the minor axis of the magneto-resistive bit 28a. Finally, the magnetic field $H_{sl}$ 52 produced by sense line current 44 also extends downward along the minor axis of the magneto-resistive bit 28a.

The magnetic field $H_{wl}$ 48 produced by word line current 40 provides the longitudinal force to switch the magnetization vector of the selected magneto-resistive bit from left to right, which in the example shown, corresponds to the desired value to be written to the magneto-resistive bit 28a. The magnetic field $H_{dl}$ 50 produced by digital line current 42 provides the lateral torque that is necessary to initiate the switching of the magnetic vector of the selected magneto-resistive bit 28a. In some cases, the magnetic field $H_{sl}$ 52 may also be provided to provide additional lateral torque.

For many applications, it is beneficial to write an entire word of data to selected magneto-resistive bits during a single write cycle. This can be accomplished by organizing the magneto-resistive bits into a number of words. For example, and referring back to FIG. 1, each word of data may correspond to a corresponding row of magneto-resistive bits, such as row 32. One such word is shown at 60. While word 60 is shown including all magneto-resistive bits 28a, 28b and 28c in row 32, it is contemplated that word 60 may in some cases only include a subset of the magneto-resistive bits in row 32, such as the first "n" magneto-resistive bits of row 32.

In another configuration, each word of data may correspond to a column of magneto-resistive bits, such as column 70. One such word is shown at 72. Again, while word 72 is shown including all magneto-resistive bits 28a, 62a, 62b, 62c, 62d, 62e, 62f, and 62g in column 70, it is contemplated that word 72 may in some cases only include a subset of the magneto-resistive bits in column 70, such as the first "n" magneto-resistive bits of column 72.

When each word of data corresponds to a row or portion of a row of magneto-resistive bits, the digital lines 18a–18h and/or sense lines 34a–34h can be used to select a particular word during a write operation. This is often accomplished by decoding a write address 80 via decoder and control block 82, and passing a current down a selected digital line and/or sense line. For example, to select the magneto-resistive bits in row 32, decoder and control block 82 may pass a current down digital line 18a and/or sense line 34a. The remaining digital lines 18b–18h and/or sense lines 34b–34h may remain deactivated to prevent the magneto-resistive bits in deselected rows from being written.

Once the appropriate digital line 18a and/or sense line 34a is activated, decode and control block 82 may provide a word line current to all of the word lines that are associated with the magneto-resistive bits of the selected word. In the example shown in FIG. 1, this includes word lines 12, 14 and 16. The polarity of the word line current for each word line typically depends on the data state to be written to the corresponding magneto-resistive bit. In one example, if the first five bits of word 60 are to be written to a zero state, the word line current provided to the first five word lines may be in a first direction. Likewise, if the last three bits of word 60 are to be written to a one state, the word line current provided to the last three word lines may be in the opposite direction. Once the word line currents are activated for a sufficient period of time to write the corresponding magneto-resistive bits, decode and control block 82 may remove all word line currents, and then remove the digital line and/or sense line currents.

Figure 3:
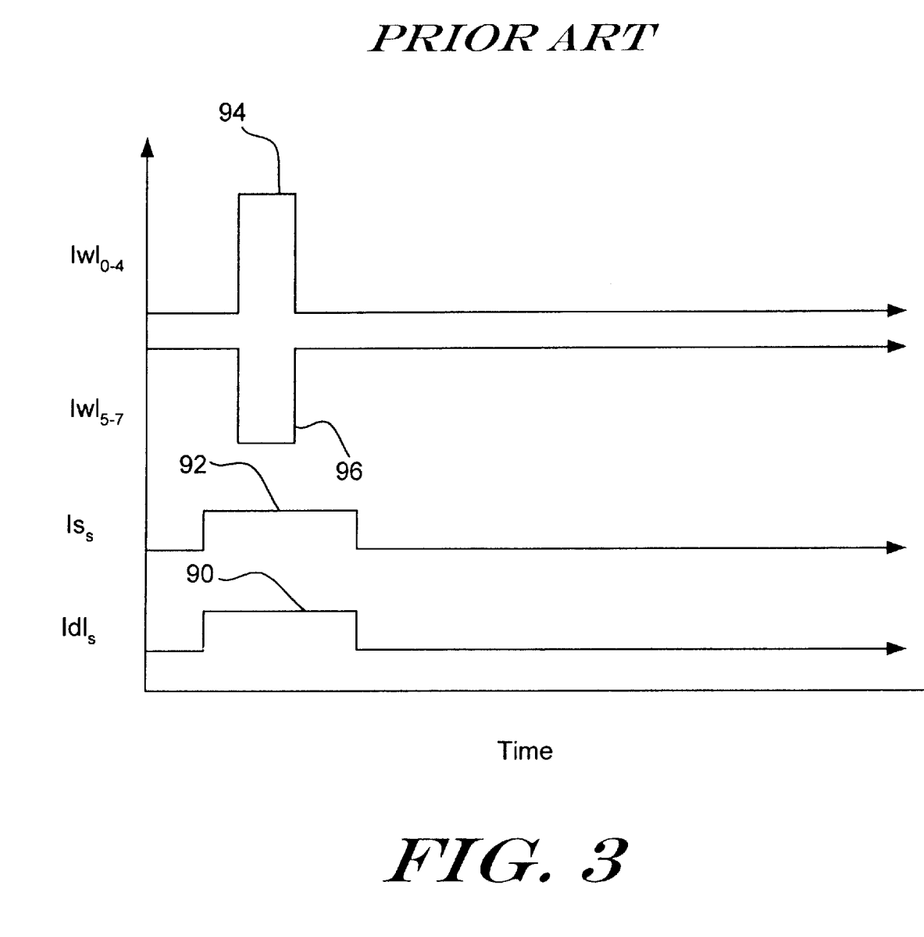
FIG. 3 is a timing diagram showing a conventional method for writing a word of data to a magneto-resistive memory.

FIG. 3 shows a timing diagram for writing the first five bits of word 60 to a first state and the last three bits of word 60 to a second state. To select an appropriate row of magneto-resistive bits, a digital line current 90 (and possibly the sense line current 92) is first provided. With the appropriate row selected, word line currents $Iwl_{0-4}$ 94 for the first five word lines are provided in a first direction. This writes the first five magneto-resistive bits of row 32 to a zero state. At the same time, word line currents $Iwl_{5-7}$ 96 for the last three bits are provided in a second direction. This writes the last three magneto-resistive bits of row 32 to a one state.

When each word of data corresponds to a column or portion of a column of magneto-resistive bits, the word lines 12, 14 and 16 may be used to select a particular word during a write operation. That is, decode and control block 82 may decode write address 80 and pass a word line current down an appropriate word line, such as word line 12, to select word 72. The remaining word lines 14 and 16 may remain deactivated to prevent the magneto-resistive bits in deselected columns from being written.

Once the appropriate word line is activated, decode and control block 82 may provide a digital line current and/or sense line current to each of the digital lines and/or sense lines that correspond to word 70, such as digital lines 18a –18h and/or sense lines 34a–34h. Often, the decode and control block 82 first provides a word line current in a first direction, and only those digital lines 18a–18h and/or sense lines 34a–34h that correspond to bits that are to be written to a first data state are activated. Thereafter, the decode and control block 82 may reverse the word line current, and only those digital lines 18a–18h and/or sense lines 34a–34h that correspond to bits that are to be written to a second opposite data state are activated.

Figure 4:
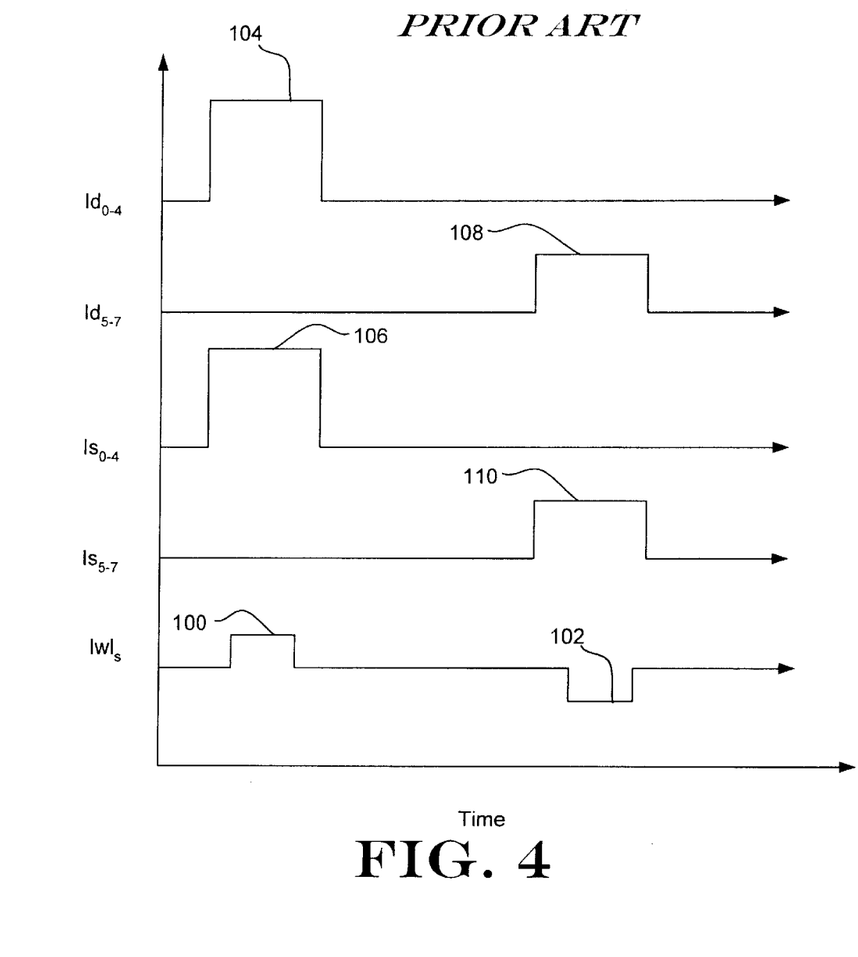
FIG. 4 is a timing diagram showing another conventional method for writing a word of data to a magneto-resistive memory.

A timing diagram illustrating such a write operation is shown in FIG. 4. The decode and control block 82 typically first asserts those digital lines and/or sense lines that correspond to bits that are to be written to a first logic state. In the example shown, the first five digital lines and/or sense lines are activated, as shown at 104 and 106, respectively. Thereafter, and to select an appropriate word, the decode and control block 82 provides a word line current to the appropriate word line. The word line current is provided in a first direction, as shown at 100. When the word line is activated, the first five magneto-resistive bits of word 72 are written to the first logic state. Once written, the word line current is deactivated, as shown. Then, the last three digital lines and/or the last three sense lines are activated, as shown at 108 and 110, respectively. Once activated, the word line current is reversed and provided in a second direction. When the word line is activated, the last three magneto-resistive bits of word 72 are written to the second logic state.

Many of the above-described writing techniques can result in relatively high peak currents. It is known that for many magneto-resistive bit structures, such as GMR bit structures, significant word line and/or digital line currents are required to change the magnetic state of the bits. Accordingly, when multiple bits are simultaneously written, as described above, the resulting peak current can be significant. The relatively high peak currents can have a significant impact on the performance and design of a memory. For example, the relatively high peak currents can cause an increase in noise on the power supply terminals of the memory, which can reduce the read and write margin of the memory. In addition, and because of the relatively high peak currents, the minimum line widths used to distribute the current may have to be increased to prevent electromigration of the metal. This can reduce the overall density of the memory.

Another limitation of many prior art writing schemes is that the digital line and/or sense line current typically remains on after the word line current is removed. By removing the word line current before the digital line current, the effective writability of the memory may be reduced. Reference is made to FIG. 2 to further illustrate this limitation. Initially, and as indicated at 112, the magneto-resistive bit 28a has an initial magnetization direction 110a that points to the left. At this time, both the digital line current 42 and the word line current 40 are zero, as shown in the timing chart at 112. Thereafter, and as indicated at 114, a digital line current 42 is applied, but the word line current 40 is still zero. The digital line current 42 produces a magnetic field $H_{DL}$ 50, which when added to the demagnetization field along 110a, produces an effective magnetic field vector 110b.

As indicated at 116, both the digital line current 42 and the word line current 40 are then applied. The word line current 42 produces a magnetic field $H_{WL}$ 48, which rotates the magnetization vector of the magneto-resistive bit 28a, resulting in an effective field vector 110c. Once the magnetization vector has been rotated as indicated at 118, the word line current 40 is removed. However, because the digital line current 42 remains on, the effective field vector 110c becomes vector 110d. As a result of an off-axis field 110d, the magnetization reversal of MR bit 28a might be incomplete. Consequently, as indicated at 120, when both the digital line current 42 and the word line current 40 are removed, the final state of the magnetization may be in an undesired state, which may cause bit errors.

SUMMARY OF THE INVENTION

The present invention overcomes many of the disadvantages of the prior art by providing write techniques for magneto-resistive memories that reduce the peak current during a write operation. In a preferred embodiment, this is accomplished by sequentially activating selected word lines, digital lines and/or sense lines. Because the word lines, digital lines and/or sense lines are sequentially activated, rather than activated in parallel, the peak current experienced during write operations may be reduced.

The present invention also provides write techniques that increase the margin of write operations of magneto-resistive memories. This is preferably accomplished by actively forcing the magnetization vector of a magneto-resistive bit to be substantially parallel with the major axis of the magneto-resistive bit during the write operation.

As indicated above, many magneto-resistive memories have a number of magneto-resistive bits organized into a number of words. In some memory architectures, all of the magneto-resistive bits in a word are selected by a common digital line and/or a common sense line, and each bit in a word is selected by a different word line. In other memory architectures, all of the magneto-resistive bits in a word are selected by a common word line, and each bit in a word is selected by a different digital line and/or different sense line.

In first illustrative embodiment of the present invention, all of the magneto-resistive bits in a word are selected by a common word line, and each magneto-resistive bit in a particular word is selected by a different digital line and/or sense line. To write such a memory, a selected one of the word lines is first activated to select all of the magneto-resistive bits in a desired word. Thereafter, the digital lines and/or sense lines that correspond to selected magneto-resistive bits in the desired word are sequentially activated. Because the digital lines and/or sense lines are sequentially activated, rather than activated in parallel, the peak currents experienced during write operations may be reduced.

The polarity of the word line current typically determines the value that is written to the corresponding magneto-resistive bits. Accordingly, the word line current is preferably provided in a first direction, which selects all of the magneto-resistive bits in a desired word. Thereafter, a first subset of digital lines and/or sense lines are sequentially activated, wherein the first subset of digital lines and/or sense lines correspond to those magneto-resistive bits that are to be written to a first logic state. Then, the word line current is reversed, which again selects all of the magneto-resistive bits in the desired word. With the word line current reversed, a second subset of digital lines and/or sense lines are sequentially activated, wherein the second subset of digital lines and/or sense lines correspond to those magneto-resistive bits that are to be written to a second logic state.

In another illustrative embodiment of the present invention, all of the magneto-resistive bits in a word are selected by a common digital line, and each magneto-resistive bit in a particular word is selected by a different word line. To write such a memory, a selected one of the digital lines is first activated to select all of the magneto-resistive bits in a desired word. Thereafter, the word lines that correspond to selected magneto-resistive bits in the desired word are sequentially activated. Because the word lines are sequentially activated, rather than activated in parallel, the peak current experienced during a corresponding write operation may be reduced.

The selected digital line is activated during the entire period that the word lines are sequentially activated. Alternatively, the digital line may be separately activated each time a word line is activated. By only activating the selected digital line when a word line is activated, the overall power consumed by the memory device may be reduced.

As indicated above, the polarity of the word line current typically determines the value that is written to the corresponding magneto-resistive bit. Accordingly, the direction of the word line current for each word line is preferably dependent on the desired data state to be written. For example, a word line current is preferably provided in a first direction for those word lines that correspond to magneto-resistive bits that are to be written to a first logic state. Likewise, the word line current is preferably provided in a second direction for those word lines that correspond to magneto-resistive bits that are to be written to a second logic state.

Rather than only activating the selected digital line, it is contemplated that a corresponding sense line may also be activated. Preferably, the selected sense line corresponds to the same word as the selected digital line. The additional sense line current may improve selectivity by providing additional torque at the desired magneto-resistive bits to help rotate the magnetization vector of the selected magneto-resistive bits.

For some memories, the sense line current may be sufficient to provide the desired selectivity. That is, the digital line current may not be required. To write such a memory, a selected one of the sense lines is first activated to select all of the magneto-resistive bits in a desired word. Thereafter, the word lines that correspond to selected magneto-resistive bits in the desired word are sequentially activated. Because word lines are sequentially activated, rather than activated in parallel, the peak current experienced during a corresponding write operation may be reduced.

To increase the write margin of many magneto-resistive memory devices, the present invention also contemplates providing write techniques that actively force the magnetization vector of a magneto-resistive bit to be substantially parallel with the major axis of the magneto-resistive bit during a write operation. This is preferably accomplished by removing the word line current after the digital line and/or sense line currents are removed. Since the word line current typically generates a magnetic field along the major axis of the bit, the word line current helps actively force the magnetization vector of the bit to be substantially parallel with the major axis of the bit. By actively forcing the magnetization vector of the magneto-resistive bit to be substantially parallel with the major axis of the bit, the margin of the write operation may be increased.

In one illustrative method of the present invention, the word line current and the digital line current (and in some cases the sense line current) are initially provided. Once the magnetization vector of the desired bits are switched, the digital line current and/or sense line current are removed before the word line current is removed. With the digital line current and/or sense line current removed, the word line current can actively force the magnetization vector of the bits to be substantially parallel with the major axis of the bits.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 5:
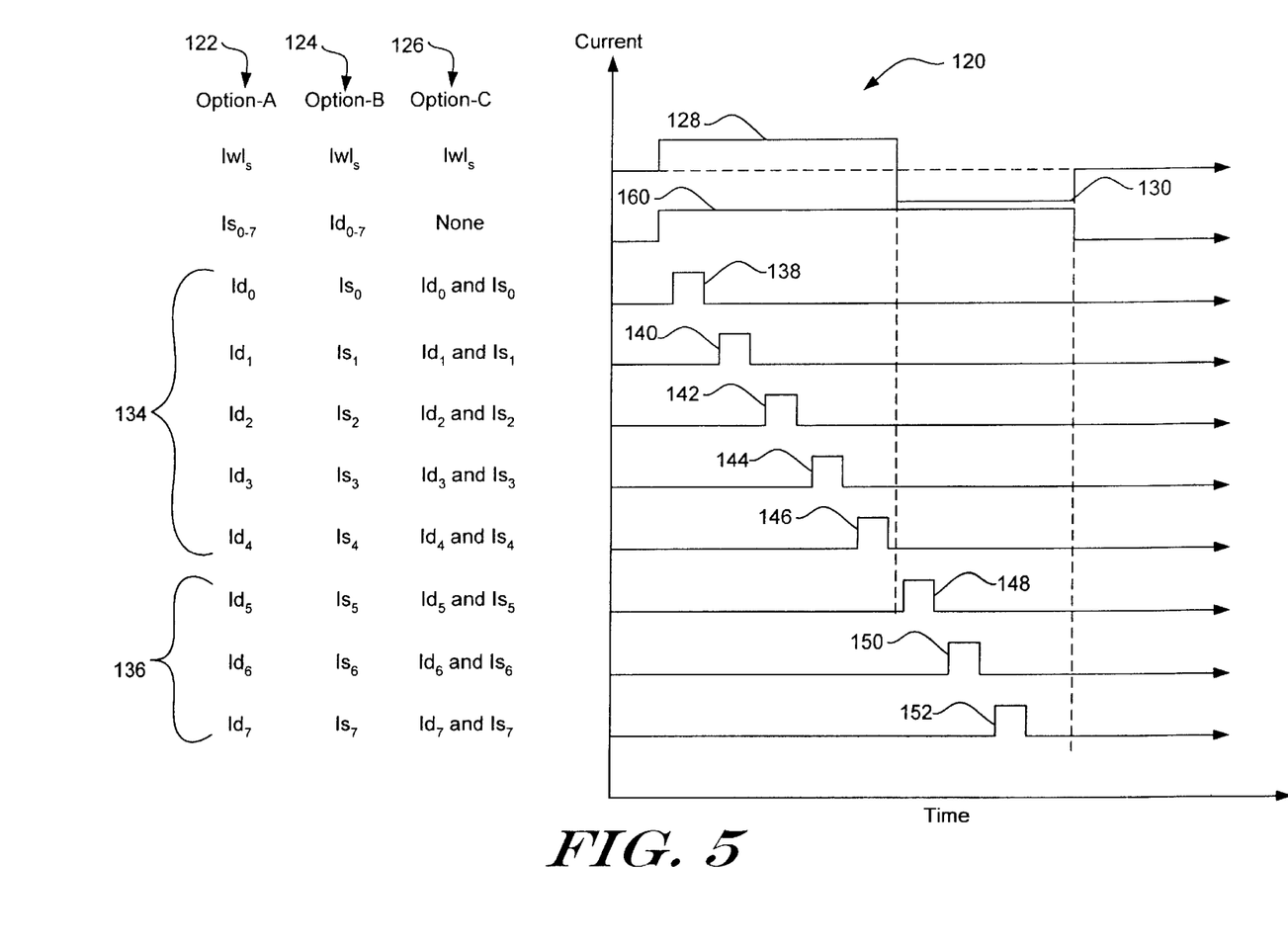
FIG. 5 is a timing diagram showing a number of illustrative methods for writing a word of data to a magneto-resistive memory in accordance with the present invention.

FIG. 5 is a timing diagram showing a number of illustrative methods for writing a word of data to a magneto-resistive memory in accordance with the present invention. A first illustrative method is shown at 122, a second illustrative method is shown at 124, and a third illustrative method is shown at 126. Each of these illustrative methods are preferably implemented using a magneto-resistive memory similar to that described above with respect to FIG. 1, wherein all of the magneto-resistive bits in a word are selected by a common word line.

As indicated above, the polarity of the word line current typically determines the value to be written to the corresponding magneto-resistive bits. Accordingly, for each of the illustrative methods 122, 124, and 126, a word line current is provided to a selected word line ($Iwl_s$) in a first direction, which selects all of the magneto-resistive bits in a desired word. In the illustrative diagram, this is shown by positive current pulse $Iwl_s$ 128. Thereafter, the word line current in the selected word line ($Iwl_s$) is reversed, which again selects all of the magneto-resistive bits in the desired word. In the illustrative diagram, this is shown by negative current pulse $Iwl_s$ 130.

Referring now specifically to method 122, during the positive word line current pulse $Iwl_s$ 128, a first subset of digital lines are sequentially activated. The first subset of digital lines preferably corresponds to those magneto-resistive bits that are to be written to a first logic state. Thereafter, and during the negative word line current pulse $Iwl_s$ 130, a second subset of digital lines are sequentially activated. The second subset of digital lines preferably corresponds to those magneto-resistive bits that are to be written to a second logic state.

In the example shown, the first five bits of an eight bit word (such as word 60 of FIG. 1) are written to the first logic state and the last three bits of the word are written to the second logic state. Accordingly, the first five digital lines $Id_{0-4}$ 134 are sequentially pulsed, as shown at 138–146, during the positive word line current pulse $Iwl_s$ 128. Likewise, the last three digital lines $Id_{5-7}$ 136 are sequentially pulsed, as shown at 148–152, during the negative word line current pulse $Iwl_s$ 130. Although the first five digital lines $Id_{0-4}$ 134 are shown to be pulsed in order (i.e., From $Id_0$ to $Id_4$), it is contemplated that the digital lines may be sequentially pulsed in any order (such as $Id_1$, $Id_4$, $Id_0$, $Id_3$, and $Id_2$). Likewise, it is contemplated that the last three digital lines may be sequentially pulsed in any order (such as $Id_6$, $Id_5$, and $Id_7$). Finally, and depending the selectivity of the memory, each of the sense lines $Is_{0-7}$ may be activated during the entire write cycle, as shown at 160.

In method 122, the digital lines are used to select and write individual magneto-resistive bits of the selected word. In method 124, the sense lines are used for the same purpose. That is, during the positive word line current pulse $Iwl_s$ 128, a first subset of sense lines are sequentially activated. The first subset of sense lines preferably corresponds to those magneto-resistive bits that are to be written to a first logic state. Thereafter, and during the negative word line current pulse $Iwl_s$ 130, a second subset of sense lines are sequentially activated. The second subset of sense lines preferably corresponds to those magneto-resistive bits that are to be written to a second logic state. In this embodiment, and depending the selectivity of the memory, each of the digital lines $Id_{0-7}$ may also be activated during the entire write cycle, as shown at 160.

In method 126, both the digital lines and sense lines are used to select and write individual magneto-resistive bits of the selected word. In this embodiment, a first subset of digital lines and the corresponding sense lines are sequentially activated during the positive word line current pulse $Iwl_s$ 128. The first subset of digital lines and corresponding sense lines preferably correspond to those magneto-resistive bits that are to be written to a first logic state. Thereafter, and during the negative word line current pulse $Iwl_s$ 130, a second subset of digital lines and corresponding sense lines are sequentially activated. The second subset of digital lines and corresponding sense lines preferably correspond to those magneto-resistive bits that are to be written to a second logic state.

Figure 6:
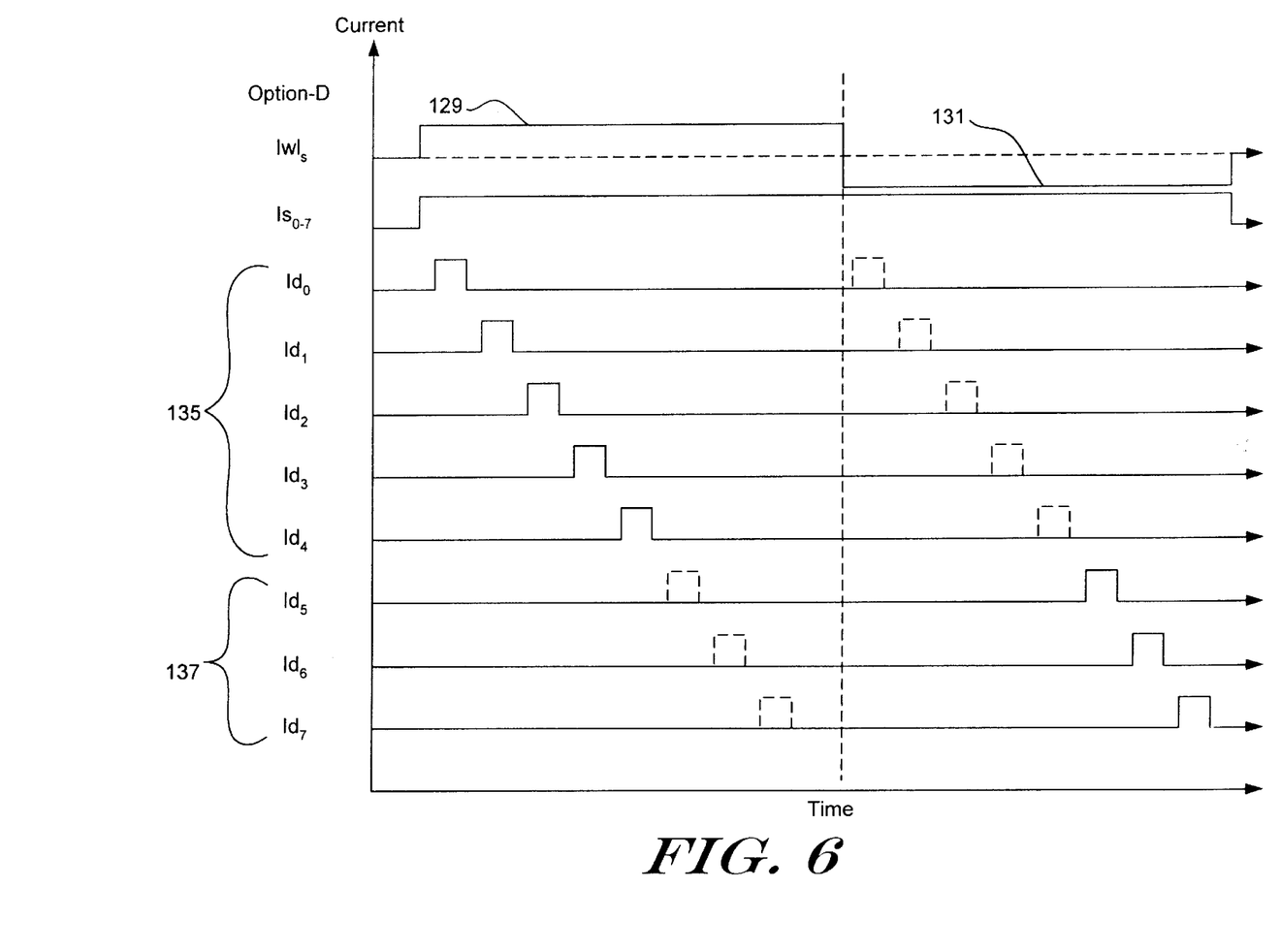
FIG. 6 is a timing diagram showing another illustrative method for writing a word of data to a magneto-resistive memory in accordance with the present invention.

FIG. 6 is a timing diagram showing yet another illustrative method for writing a word of data to a magneto-resistive memory in accordance with the present invention. As indicated above, the polarity of the word line current typically determines the value to be written to the corresponding magneto-resistive bits. Accordingly, a word line current is first provided to a selected word line ($Iwl_s$) in a first direction, which selects all of the magneto-resistive bits in a desired word. This is shown by positive current pulse $Iwl_s$ 129. Thereafter, the word line current in the selected word line ($Iwl_s$) is reversed, which again selects all of the magneto-resistive bits in the desired word. This is shown by negative current pulse $Iwl_s$ 131.

During the positive word line current pulse $Iwl_s$ 129, all of the digital lines are sequentially activated. However, control circuitry (not shown) only allows current pulses to be provided to those digital lines that correspond to the magneto-resistive bits that are to be written to a first logic state. The control circuitry prevents current pulses from being provided to those digital lines that correspond to the magneto-resistive bits that are to be written to a second logic state.

During the negative word line current pulse $Iwl_s$ 131, all of the digital lines are again sequentially activated. However, the control circuitry now only allows current pulses to be provided to those digital lines that correspond to the magneto-resistive bits that are to be written to the second logic state, and prevents current pulses from being provided to those digital lines that correspond to the magneto-resistive bits that are to be written to the first logic state.

In the example shown, the first five bits of an eight bit word (such as word 60 of FIG. 1) are written to the first logic state and the last three bits of the word are written to the second logic state. The illustrative method allows all of the digital lines to be sequentially activated. However, the control circuitry only allows current pulses to be provided on the first five digital lines $Id_{0-4}$ 135 during the positive word line current pulse $Iwl_s$ 129. The control circuitry prevents current pulses from being provided on the last three digital lines $Id_{5-7}$ 137 during the positive word line current pulse $Iwl_s$ 129. The current pulses that are blocked by the control circuitry are shown in phantom.

During the negative word line current pulse $Iwl_s$ 131, all of the digital lines are again sequentially activated.

However, the control circuitry now prevents current pulses from being provided on the first five digital lines $Id_{0-4}$ 135, and allows current pulses to be provided on the last three digital lines $Id_{5-7}$ 137. Again, the current pulses that are blocked by the control circuitry are shown in phantom. In some memory designs, it is believed that this construction may be easier to implement. It is also contemplated that this illustrative method may be applied or used in conjunction with the methods 122, 124 and 126 of FIG. 5, or the method disclosed below with respect to FIG. 7.

Figure 7:
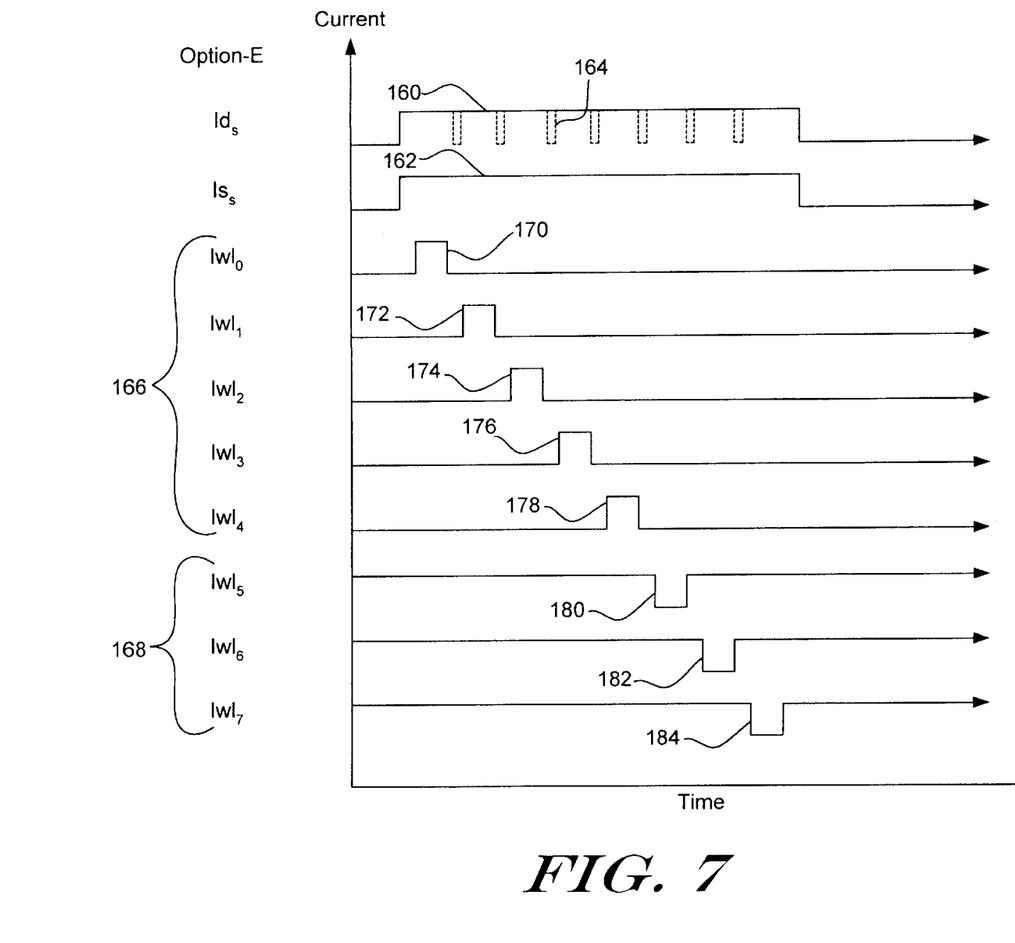
FIG. 7 is a timing diagram showing yet another illustrative method for writing a word of data to a magneto-resistive memory in accordance with the present invention.

FIG. 7 is a timing diagram showing yet another illustrative method for writing a word of data to a magneto-resistive memory in accordance with the present invention. This illustrative method is preferably implemented using a magneto-resistive memory similar to that described above with respect to FIG. 1, wherein all of the magneto-resistive bits in a word are selected by a common digital line and/or a common sense line. Further, each of the magneto-resistive bits in a particular word are preferably selected by different word lines.

A selected digital line $Id_s$ is first activated to select all of the magneto-resistive bits in a desired word, as shown at 160. Thereafter, the word lines that correspond to selected magneto-resistive bits in the desired word are sequentially activated. Because the word lines are sequentially activated rather than activated in parallel, the peak current experienced during a corresponding write operation may be reduced.

It is also contemplated that the selected digital line $Id_s$ may be separately activated each time one of the word lines is activated, as shown at 164. By only activating the selected digital line $Id_s$ when a word line is activated, the overall power consumed by the memory device may be reduced.

Because the polarity of the word line current typically determines the value that is written to the corresponding magneto-resistive bit, the direction of the word line current for each word line is preferably dependent on the desired data state to be written. For example, a word line current is preferably provided in a first direction to those word lines that correspond to magneto-resistive bits that are to be written into a first logic state. Continuing with the above example, the word line current provided to the first five word lines $Iwl_{0-4}$ 166 may be provided in a first direction, as shown at 170–178, and the word line current provided to the last three word lines $Iwl_{5-7}$ 168 may be provided in a second direction, as shown at 180–184. This may cause the first five bits of the word to be written to the first logic state, and the last three bits of the word to be written to the second logic state.

Rather than only activating the selected digital line, it is contemplated that a corresponding sense line $Is_s$ may also be activated, as shown at 162. Preferably, the selected sense line corresponds to the same word as the selected digital line. The additional sense line current may improve selectivity by providing additional lateral torque at the desired magneto-resistive bits to help rotate the magnetization vector of the selected magneto-resistive bits.

For some memories, the sense line current $Is_s$ 162 may be sufficient to provide the desired selectivity. That is, the digital line current $Id_s$ 160 may not be required. To write such a memory, a selected one of the sense lines is first activated to select all of the magneto-resistive bits in a desired word. Thereafter, the word lines that correspond to selected magneto-resistive bits in the desired word are sequentially activated.

Figure 8:
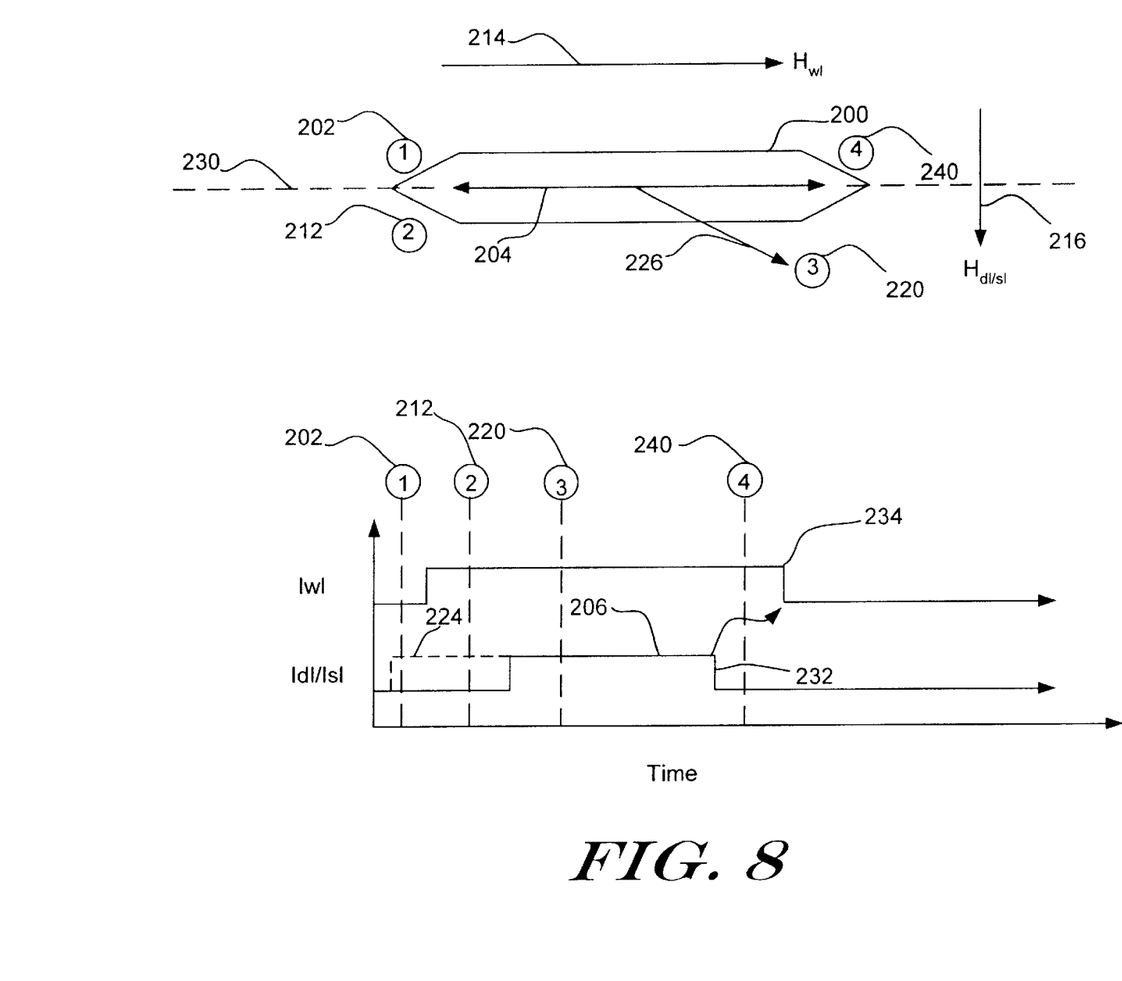
FIG. 8 is a diagram illustrating a method for writing one or more magneto-resistive bits in accordance with the present invention.

FIG. 8 is a diagram illustrating a method for writing one or more magneto-resistive bits in accordance with the present invention. To increase the write speed of many magneto-resistive memory devices, the present invention contemplates actively forcing the magnetization vector of a magneto-resistive bit to be substantially parallel with the major axis of the magneto-resistive bit during the write operation. This is preferably accomplished by removing the word line current after the digital line and/or sense line currents are removed.

FIG. 8 shows a magneto-resistive bit 200 along with a timing diagram for writing the magneto-resistive bit. Initially, and as indicated at 202, the magneto-resistive bit 200 has an initial magnetization direction 204 that points to the left. At this time, the word line current 208 is at zero, as shown in the timing diagram at 202. Thereafter, and as indicated at 212, the word line current 208 is applied. The word line current 208 produces a magnetic field $H_{wl}$ 214. However, because of the selectivity of the magneto-resistive bit 200, the magnetization vector 204 does not change.

To rotate the magnetic vector 204, a magnetic field orthogonal to the major axis of the bit 200 must be applied, preferably by applying a digital line current or a sense line current. At time 220, a digital line and/or sense line current 206 is applied. As indicated in dashed line 224, however, the digital line and/or sense line current 206 may be applied earlier, if desired. In any case, the magnetic field $H_{dl/sl}$ 216 provided by the digital line and/or sense line current 206 provides the necessary torque to offset magnetic vector 204, allowing the word line magnetic field $H_{wl}$ 214 to rotate the magnetic vector of the magneto-resistive bit 200 to position 226. However, the digital line and/or sense line magnetic field $H_{dl/sl}$ 216 keeps the magnetic vector of the magneto-resistive bit 200 offset from the major axis 230 of the magneto-resistive bit 200.

Once the magnetization vector of the magneto-resistive bit 200 has been rotated to position 226, the digital line and/or sense line current 206 is removed, as shown at 232. Thus, at time 240, the word line current 234 is the only current remaining. By removing the digital line and/or sense line current 206, the lateral torque applied to the magnetization vector of the magneto-resistive bit 200 by the digital line and/or sense line magnetic field $H_{dl/sl}$ 216 is removed. This allows the magnetization vector of the magnetic bit 220 to rotate and align with the major axis 230 of the magnetic bit 220. The speed of this rotation may be increased because the word line current 208 remains on. That is, the word line magnetic field $H_{wl}$ 214 may help force the magnetization vector of the magnetic bit 220 to rotate and align with the major axis 230 of the magnetic bit 220. By actively forcing the magnetization vector of the magneto-resistive bit 220 to be substantially parallel with the major axis 230 of the bit, the speed of the write operation may be reduced.

Having thus described the preferred embodiments of the present invention, those of skill in the art will readily appreciate that the teachings found herein may be applied to yet other embodiments within the scope of the claims hereto attached.

What is claimed is:

1. A method for writing a magneto-resistive memory, the magneto-resistive memory having a number of magneto-resistive bits organized into a number of words, a number of word lines and a number of digital lines, all of the magneto-resistive bits in a word being selected by a common digital line, and each of the magneto-resistive bits in a word being selected by different word lines, the method comprising the steps of:

activating a selected one of the digital lines, which selects all of the magneto-resistive bits in a corresponding word; and sequentially activating the word lines that correspond to selected magneto-resistive bits in the corresponding word.

2. A method according to claim 1, wherein the selected digital line is activated during the entire period that the word lines are sequentially activated.

3. A method according to claim 1, wherein the activating step activates the selected digital line by providing an activating current to the selected digital line.

4. A method according to claim 1, wherein the sequentially activating step sequentially activates the word lines by providing an activating current to the word lines.

5. A method according to claim 4, wherein the sequentially activating step provides an activating current in a first direction for those word lines that correspond to magneto-resistive bits that are to be written to a first logic state.

6. A method according to claim 5, wherein the sequentially activating step provides an activating current in a second direction for those word lines that correspond to magneto-resistive bits that are to be written to a second logic state.

7. A method according to claim 1, wherein the magneto-resistive memory further includes a number of sense lines, wherein all of the magneto-resistive bits in a word are selected by a common sense line.

8. A method according to claim 7, further including the step of activating the sense line that selects the magneto-resistive bits of the word that corresponds to the selected digital line.

9. A method for writing a magneto-resistive memory, the magneto-resistive memory having a number of magneto-resistive bits organized into a number of words, a number of word lines and a number of sense lines, all of the magneto-resistive bits in a word being selected by a common sense line, and each of the magneto-resistive bits in a word being selected by different word lines, the method comprising the steps of:

activating a selected one of the sense lines, which selects all of the magneto-resistive bits in a corresponding word; and sequentially activating the word lines that correspond to selected magneto-resistive bits in the corresponding word.

10. A method according to claim 9, wherein the selected sense line is activated during the entire period that the word lines are sequentially activated.

11. A method according to claim 9, wherein the activating step activates the selected sense line by providing an activating current to the selected sense line.

12. A method according to claim 9, wherein the sequentially activating step sequentially activates the word lines by providing an activating current to the word lines.

13. A method according to claim 12, wherein the sequentially activating step provides an activating current in a first direction for those word lines that correspond to magneto-resistive bits that are to be written to a first logic state.

14. A method according to claim 13, wherein the sequentially activating step provides an activating current in a second direction for those word lines that correspond to magneto-resistive bits that are to be written to a second logic state.

15. A method according to claim 9, wherein the magneto-resistive memory further includes a number of digital lines, wherein all of the magneto-resistive bits in a word are selected by a common digital line.

16. A method according to claim 15, further including the step of activating the digital line that selects the magneto-resistive bits of the word that corresponds to the selected sense line.

17. A method for writing a magneto-resistive memory, the magneto-resistive memory having a number of magneto-resistive bits organized into a number of words, a number of word lines and a number of digital lines, all of the magneto-resistive bits in a word being selected by a common word line, and each of the magneto-resistive bits in a word being selected by different digital lines, the method comprising the steps of:

activating a selected one of the word lines, which selects all of the magneto-resistive bits in a corresponding word; and sequentially activating the digital lines that correspond to selected magneto-resistive bits in the corresponding word.

18. A method according to claim 17, wherein the selected word line is activated during the entire period that the selected digital lines are sequentially activated.

19. A method according to claim 17, wherein the activating step activates the selected word line by providing an activating current to the selected word line.

20. A method according to claim 19, wherein the sequentially activating step sequentially activates the digital lines by providing an activating current to the selected digital lines.

21. A method for writing a magneto-resistive memory, the magneto-resistive memory having a number of magneto-resistive bits organized into a number of words, a number of word lines and a number of sense lines, all of the magneto-resistive bits in a word being selected by a common word line, and each of the magneto-resistive bits in a word being selected by different sense lines, the method comprising the steps of:

activating a selected one of the word lines, which selects all of the magneto-resistive bits in a corresponding word; and sequentially activating the sense lines that correspond to selected magneto-resistive bits in the corresponding word.

22. A method according to claim 21, wherein the selected word line is activated during the entire period that the selected sense lines are sequentially activated.

23. A method according to claim 21, wherein the activating step activates the selected word line by providing an activating current to the selected word line.

24. A method according to claim 23, wherein the sequentially activating step sequentially activates the sense lines by providing an activating current to the selected sense lines.

25. A method for writing a magneto-resistive memory, the magneto-resistive memory having a number of magneto-resistive bits organized into a number of words, a number of word lines and a number of digital lines, all of the magneto-resistive bits in a word being selected by a common word line, and each of the magneto-resistive bits in a word being selected by different digital lines, the method comprising the steps of:

providing a current in a first direction to a selected one of the word lines, which selects all of the magneto-resistive bits in a corresponding word;

sequentially activating a first subset of those digital lines that correspond to selected magneto-resistive bits in the corresponding word, the first subset of digital lines corresponding to those magneto-resistive bits that are to be written to a first logic state;

providing a current in a second direction to the selected word line; and sequentially activating a second subset of those digital lines that correspond to the selected magneto-resistive bits in the corresponding word, the second subset of digital lines corresponding to those magneto-resistive bits that are to be written to a second logic state.

26. A method according to claim 25, wherein the magneto-resistive memory further includes a number of sense lines, wherein all of the magneto-resistive bits in a word are selected by a common sense line.

27. A method according to claim 26, further including the step of activating the sense lines that correspond to the magneto-resistive bits in the corresponding word.

28. A method according to claim 26, further including the steps of sequentially activating a first subset of those sense lines that correspond to the selected magneto-resistive bits in the corresponding word, the first subset of sense lines corresponding to those magneto-resistive bits that are to be written to the first logic state; and sequentially activating a second subset of those sense lines that correspond to the selected magneto-resistive bits in the corresponding word, the second subset of sense lines corresponding to those magneto-resistive bits that are to be written to the second logic state.

29. A method for writing a magneto-resistive memory element, the magneto-resistive memory element having a word line and a digital line extending adjacent a magneto-resistive bit, the method comprising the steps of:

providing a current to the word line;

providing a current to the digital line; and removing the current to the digital line before removing the current to the word line.

30. A method according to claim 29, wherein the magneto-resistive bit is included in a sense line, the method further comprising the steps of:

providing a current to the sense line; and removing the current to the sense line before removing the current to the word line.

31. A method for writing a magneto-resistive memory element, the magneto-resistive memory element having a word line extending adjacent a magneto-resistive bit, and the magneto-resistive bit being included in a sense line, the method comprising the steps of:

providing a current to the word line;

providing a current to the sense line; and removing the current to the sense line before removing the current to the word line.

* * * * *

UNITED STATES PATENT AND TRADEMARK OFFICE
CERTIFICATE OF CORRECTION

PATENT NO.     : 6,363,007 B1                                              Page 1 of 1
DATED          : March 26, 2002
INVENTOR(S)    : Lu et al.

It is certified that error appears in the above-identified patent and that said Letters Patent is hereby corrected as shown below:

Column 1,
Line 56, please replace "umber" with -- number --.

Signed and Sealed this

Eighteenth Day of March, 2003

JAMES E. ROGAN
*Director of the United States Patent and Trademark Office*